United States Patent
Hunt

(10) Patent No.: US 6,897,703 B2
(45) Date of Patent: May 24, 2005

(54) VOLTAGE CLAMP CIRCUIT

(75) Inventor: Ken S. Hunt, Berkshire (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/229,901

(22) Filed: Aug. 28, 2002

(65) Prior Publication Data
US 2003/0090309 A1 May 15, 2003

(30) Foreign Application Priority Data
Nov. 9, 2001 (GB) ................................ 0127012

(51) Int. Cl.⁷ ............................ H03K 5/08; H03L 5/00
(52) U.S. Cl. ...................................... 327/313; 327/327
(58) Field of Search ................................ 327/309, 312, 327/313, 327, 328

(56) References Cited

U.S. PATENT DOCUMENTS

| | | | |
|---|---|---|---|
| 4,439,802 A | 3/1984 | Johansson | 361/56 |
| 5,528,190 A * | 6/1996 | Honnigford | 327/328 |
| 5,581,104 A | 12/1996 | Lowrey et al. | 257/355 |
| 5,644,215 A | 7/1997 | Casper | 323/274 |
| 5,811,990 A | 9/1998 | Blodgett et al. | 326/81 |
| 5,831,419 A | 11/1998 | Casper | 323/274 |
| 5,872,736 A | 2/1999 | Keeth | 365/189.05 |
| 5,896,041 A | 4/1999 | Sher et al. | 326/38 |
| 5,959,494 A * | 9/1999 | Fotouhi | 327/427 |
| 6,031,408 A * | 2/2000 | Flannagan | 327/349 |
| 6,043,542 A | 3/2000 | Keeth et al. | 257/372 |
| 6,072,729 A | 6/2000 | Casper | 365/189.05 |
| 6,078,487 A | 6/2000 | Partovi et al. | 361/56 |
| 6,255,886 B1 | 7/2001 | Manning | 327/325 |
| 6,256,235 B1 | 7/2001 | Lee | 365/189.11 |
| 6,346,827 B1 * | 2/2002 | Yeung et al. | 326/41 |
| 6,351,180 B1 | 2/2002 | Sher et al. | 327/541 |
| 6,437,600 B1 | 8/2002 | Keeth | 326/86 |
| 6,504,396 B2 | 1/2003 | Sher et al. | 326/21 |
| 6,504,421 B2 | 1/2003 | Blodgett et al. | 327/536 |
| 2002/0030539 A1 | 3/2002 | Sher et al. | 327/541 |

FOREIGN PATENT DOCUMENTS

| | | | |
|---|---|---|---|
| EP | 0967721 | 12/1999 | H03K/17/0814 |
| GB | 2034996 | 6/1980 | H03G/11/00 |
| GB | 2277614 | 11/1994 | H02M/1/08 |
| GB | 2330957 | 5/1999 | H02H/9/04 |

* cited by examiner

Primary Examiner—Quan Tra
(74) Attorney, Agent, or Firm—Schwegman, Lundberg, Woessner & Kluth, P.A.

(57) ABSTRACT

A voltage clamp circuit is disclosed and claimed. The voltage clamp circuit includes a bypass device and a differential sense amplifier or comparator adapted to control operation of the bypass device. The bypass device is activated in response to the differential sense amplifier or comparator sensing a voltage above a predetermined level.

68 Claims, 7 Drawing Sheets

VOLTAGE CLAMP CIRCUIT

CLAIM OF PRIORITY

This application claims priority under 35 U.S.C. 119 from British Application No. 0127012.3 filed Nov. 9, 2001, which is incorporated herein by reference.

FIELD OF THE INVENTION

The present invention relates generally to semiconductor integrated circuits, and more particularly to a voltage clamp circuit.

BACKGROUND OF THE INVENTION

Current and future electronic systems, such as computer systems and the like, are being required to perform more functions at ever increasing speeds. As a result such electronic or computer systems are being required to operate at increasingly higher voltages. Memory systems are also becoming larger and are being required to operate faster which can also call for higher voltages and power. Accordingly, voltage and current extremes can sometimes occur in these systems causing damage to internal components or adversely affecting performance of some components.

Additionally, in computer systems and the like there is a Peripheral Component Interconnect (PCI) specification or standard for the connection of different peripheral or auxiliary circuit boards or cards to a personal computer (PC) motherboard, processor or the like. Such cards may include graphics cards, disk drive cards, sound cards and the like that can be plugged into PCI slots associated with the PC motherboard. These peripheral cards are typically designed for plug and play applications. A problem with such circuit cards or boards is that they typically are not terminated or grounded and a signal sent to the circuit card can be at least partially reflected back to the source. For compliance with the PCI specification, circuits or systems must be able to handle a voltage doubled signal. For example if a five volt signal is sent, a ten volt signal may be reflected back. A standing wave may effectively be created on the communications bus and the signal that is reflected can become superimposed on the original signal effectively doubling the voltage on the bus.

Voltage protection devices or circuits used to protect against over-voltage, such as reflected voltages in a computer system, are typically connected externally to the semiconductor chip and can occupy considerable area on a semiconductor die or circuit board. Additionally, some voltage protection circuits or devices are not recoverable and may be damaged themselves in the course of protecting another circuit or device from over-voltage and therefore will need to be replaced after a damaging over-voltage pulse or spike. Some protection circuits or devices also may not be able to operate quickly enough to adequately prevent damage to a protected circuit or device under some circumstances. In protecting circuits that both transmit and receive information or data, such as input/output (I/O) circuits, I/O cells of a memory system or the like, it may be desirable to inactivate a protection circuit or device or to insure that the protection circuit or device will not operate when the I/O circuit is transmitting signals or information and to permit the protection circuit or device to be activated or to permit operation whenever the I/O circuit or protected device may be expected to receive signals.

Accordingly, there is a need for a protection circuit or voltage clamp circuit that can be formed as part of the semiconductor chip, that is active and recoverable and that can operate with appropriate speed under the expected operating conditions. There is also a need for a protection circuit or voltage clamp circuit that can be used with circuits or devices that both transmit and receive signals and will not adversely affect operation in a transmit mode or can be disabled in the transmit mode.

SUMMARY OF THE INVENTION

In accordance with the present invention, a voltage clamp circuit includes a bypass device and a comparator circuit adapted to control operation of the bypass device. The bypass device is activated to protect a circuit or device by the comparator circuit in response to the comparator circuit sensing a voltage greater than a predetermined voltage level.

In accordance with the present invention, a voltage clamp includes a bypass device and a differential amplifier coupled to the bypass device. The bypass device is activated in response to the differential amplifier sensing a voltage greater than a predetermined reference voltage.

In accordance with the present invention, a voltage clamp includes a first transistor coupled between a reference voltage and a first current source and a second transistor coupled between a second current source and an input/output (I/O) pad adapted to be connected to a circuit or device to be protected by the voltage clamp. A gate of the first transistor is coupled to a gate of the second transistor. A bypass transistor is coupled between the I/O pad and ground and a gate of the bypass transistor is coupled to a node between the second transistor and the second current source.

In accordance with the present invention, an electronic system includes at least one electronic circuit and a bypass device coupled to an input of the electronic circuit. The electronic system further includes a comparator coupled to the input of the electronic circuit. The bypass device may be activated to protect the electronic circuit in response to the comparator sensing a voltage greater than a predetermined reference voltage.

In accordance with the present invention, a semiconductor die includes a substrate and at least one integrated circuit supported by the substrate. The integrated circuit includes at least one internal circuit and a voltage clamp circuit coupled to the at least one internal circuit. The voltage clamp circuit includes a comparator circuit coupled to an input of the at least one internal circuit. The voltage clamp circuit also includes a bypass device coupled to an input of the at least one internal circuit. The bypass device is activated in response to the comparator circuit sensing a voltage greater than a predetermined reference voltage on the input of the at least one internal circuit.

In accordance with an embodiment of the present invention, a method for protecting an electronic device or circuit includes sensing a voltage greater than a predetermined voltage and bypassing an input of the electronic device or circuit in response to sensing the voltage greater than the predetermined voltage.

In accordance with an embodiment of the present invention, a method for making a clamp circuit includes forming a bypass device and forming a comparator circuit coupled to the bypass device, wherein the bypass device is activated in response to the comparator circuit sensing a voltage greater than a predetermined reference voltage.

In accordance with an embodiment of the present invention, a method of making an integrated circuit includes providing a substrate; forming at least one electronic circuit supported on the substrate; and forming a voltage clamp coupled to the at least one electronic circuit, wherein forming the voltage clamp includes forming a comparator circuit coupled to an input of the at least one electronic circuit, and forming a bypass device coupled to the at least one electronic circuit, wherein the bypass device is activated in response to the comparator circuit sensing a voltage greater than a predetermined reference voltage on an input of the at least one electronic circuit.

These and other embodiments, aspects, advantages and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

In the drawings, like numerals describe substantially similar components throughout the several views. Like numerals having different letter suffixes or primed (X') represent different occurrences of substantially similar components.

DESCRIPTION OF THE EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

The transistors described herein include transistors from bipolar-junction technology (BJT), field effect technology (FET), or complimentary metal-oxide-semiconductor (CMOS). A metal-oxide-semiconductor (MOS) transistor includes a gate, a first node (drain) and a second node (source). Since a MOS transistor is typically a symmetrical device, the true designation of "source" and "drain" is only possible once voltage is impressed on the terminals. The designations of source and drain herein should be interpreted, therefore, in the broadest sense. It should also be noted that a P-channel MOS transistor could alternatively be used for an N-channel MOS transistor and vice versa with the polarity of the associated gate voltages merely being reversed. For example, applying a negative gate voltage in the situation of a P-channel MOS transistor to activate the transistor and reversing the polarity to apply a positive gate voltage to activate an N-channel transistor if an N-channel MOS transistor is substituted for a P-channel transistor.

Figure 1:
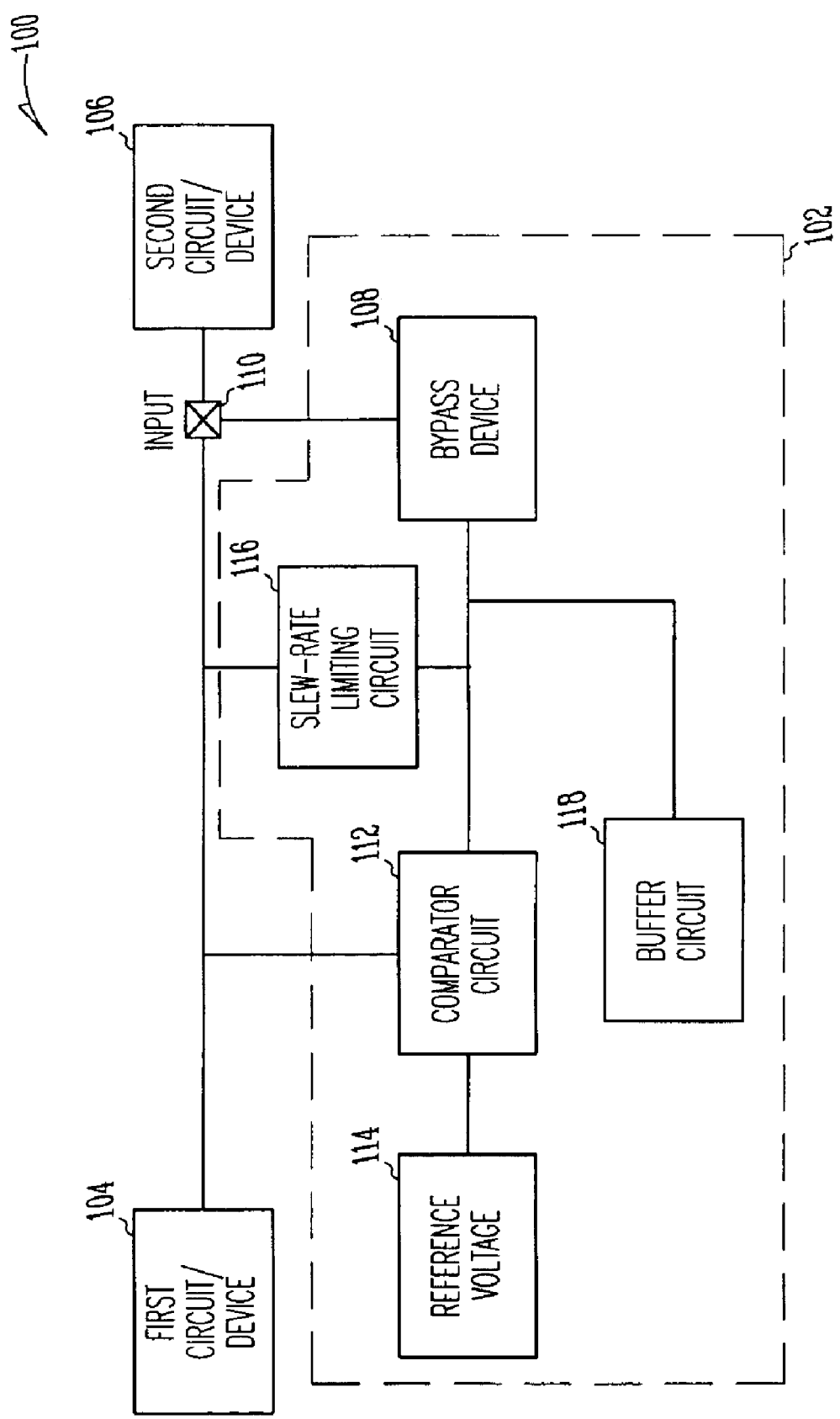
FIG. 1 is a block schematic diagram of an electronic system including a voltage clamp circuit in accordance with the present invention.

FIG. 1 is a block schematic diagram of an electronic system 100 including an example of a voltage clamp circuit 102 in accordance with the present invention. The electronic system 100 may include at least one first circuit or device 104 that may transmit and receive signals or data from a second circuit or device 106. For example, the first circuit 104 may be a processor or peripheral equipment of a computer system and the second circuit 106 may be an input/output (I/O) circuit for a memory system or other system or device. The voltage clamp circuit 102 is used in the example shown in FIG. 1 to protect the second circuit 106 from an over-voltage. The voltage clamp 102 includes a bypass device 108 coupled to an input 110 or I/O pad or pin of the second circuit 106. A comparator circuit 112 is coupled to the input 110 of the second circuit 106 and to the bypass device 108. The comparator circuit 112 is coupled to a predetermined voltage or a reference voltage 114. The comparator circuit 112 is adapted to control the operation of the bypass device 108 in response to the comparator circuit 112 sensing a voltage on the I/O pad or pin 110 of the second circuit 106 greater than the reference voltage 114. The bypass device 108 will be activated to shunt excess current away from the second circuit 106 when the comparator circuit 112 senses a voltage greater than the reference voltage 114 at the I/O pad 110. The voltage clamp circuit 102 thereby limits or restricts the voltage at the input or I/O pad 110 to no more than a voltage substantially the same magnitude as the reference voltage.

In accordance with an embodiment of the present invention, the voltage clamp circuit 102 may include a slew-rate limiting circuit 116. The slew-rate limiting circuit 116 will detect the rate of change of voltage (dv/dt) at the I/O pad 110 to the second circuit 106 and will activate the bypass device 108 if the rate of change of the voltage exceeds a selected or predetermined maximum slew-rate.

In accordance with another embodiment of the present invention, the I/O voltage clamp circuit 102 may include a driver circuit or buffer circuit 118. The buffer or driver circuit 118 may be used in electronic systems 100 where the second circuit 106 both transmits and receives signals or information. When the second circuit 106 is expected to send or transmit signals, the buffer circuit can be activated to disable the bypass device 108 or insure that the bypass device 108 will not operate and possibly interfere with the transmission of the signals. When the second circuit 106 is expected to receive signals, the buffer circuit 118 can be disabled to permit the bypass device 108 to be activated by the comparator circuit 112 or the slew-rate circuit limiting circuit 116 to protect the second circuit 106 from an overvoltage.

Figure 2:
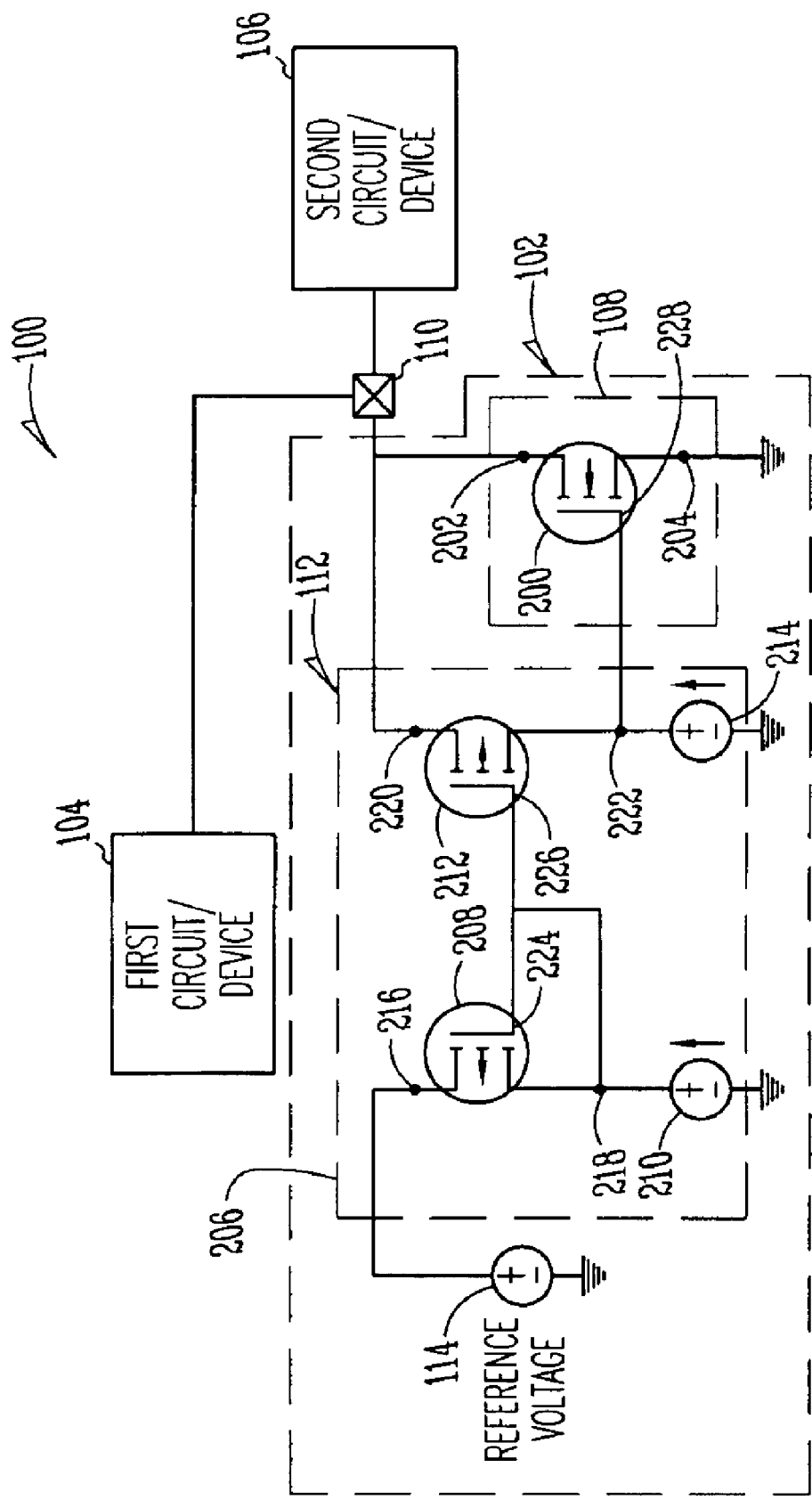
FIG. 2 a schematic diagram of an electronic system including a voltage clamp circuit in accordance with an embodiment of the present invention.

FIG. 2 a schematic diagram of the electronic system 100 including a voltage clamp circuit 102 in accordance with an embodiment of the present invention. The bypass device 102 may include a bypass transistor 200, such as an N-channel metal oxide semiconductor field effect transistor (MOSFET) or the like. The bypass transistor 200 is coupled between the I/O pad 110 of the second circuit 106 and ground. A first node or source/drain terminal 202 of the bypass transistor 200 is coupled to the I/O pad 110 and a second node or source/drain terminal 204 of the bypass transistor 200 is coupled to ground. The comparator circuit 112 of FIG. 1 may include a common gate differential sense amplifier circuit 206. The differential sense amplifier 206 may include a first transistor 208 coupled between the reference voltage source 114 and a first current source 210 or current sink and a second transistor 212 coupled between the I/O pad 110 and a second current source 214. The first transistor 208 and the second transistor 212 may each be a P-channel MOSFET transistor or the like. Accordingly, a first node or source/drain terminal 216 of the first transistor 208 may be coupled to a positive terminal of the reference voltage 114 and a second node or source/drain terminal 218 of the first transistor 208 may be coupled to a positive terminal of the first current source 210. A first node or source/drain terminal 220 of the second transistor 212 may be coupled to the I/O pad or pin 110 and a second node or source/drain terminal 222 may be coupled to a positive terminal of the second current source 214. A gate electrode or terminal 224 of the first transistor 208 is coupled to a gate electrode or terminal 226 of the second transistor 212 and both gates 224 and 226 are connected to the second node 218 between the first transistor 208 and the first current source 210. A gate electrode 228 of the bypass transistor 200 is connected to the second node 222 between the second transistor 212 and the second current source 214.

In operation, the first current source 210 and the second current source 214 may be substantially the same level or magnitude. Accordingly, if the voltage on the I/O pad 110 exceeds the reference voltage 114, there will be an increase in current flow through the second transistor 212. If the second transistor 212 conducts more current than the second current source 214 can sink or counter, the voltage at the node 222 will rise above a predetermined voltage level or magnitude to cause the bypass transistor 200 to conduct and shunt the excess current from the I/O pad 110 to ground and thereby restrict the voltage level at the I/O pad 110. Accordingly, the common gate differential amplifier 206 or comparator circuit 112 senses the excess voltage at the I/O pad 110 and uses its current gain properties to cause the active bypass transistor 200 to operate to shunt the excess current to ground. The level or magnitude of the first and second current sources 210 and 214 may be selected such that the predetermined voltage to cause the bypass transistor 200 to conduct is substantially equivalent in magnitude to the reference voltage, or the magnitudes of the first and second current sources 210 and 214 may be selectively different such that the predetermined voltage is some chosen magnitude greater than or less than the reference voltage 114 to satisfy design or operational requirements.

Figure 3:
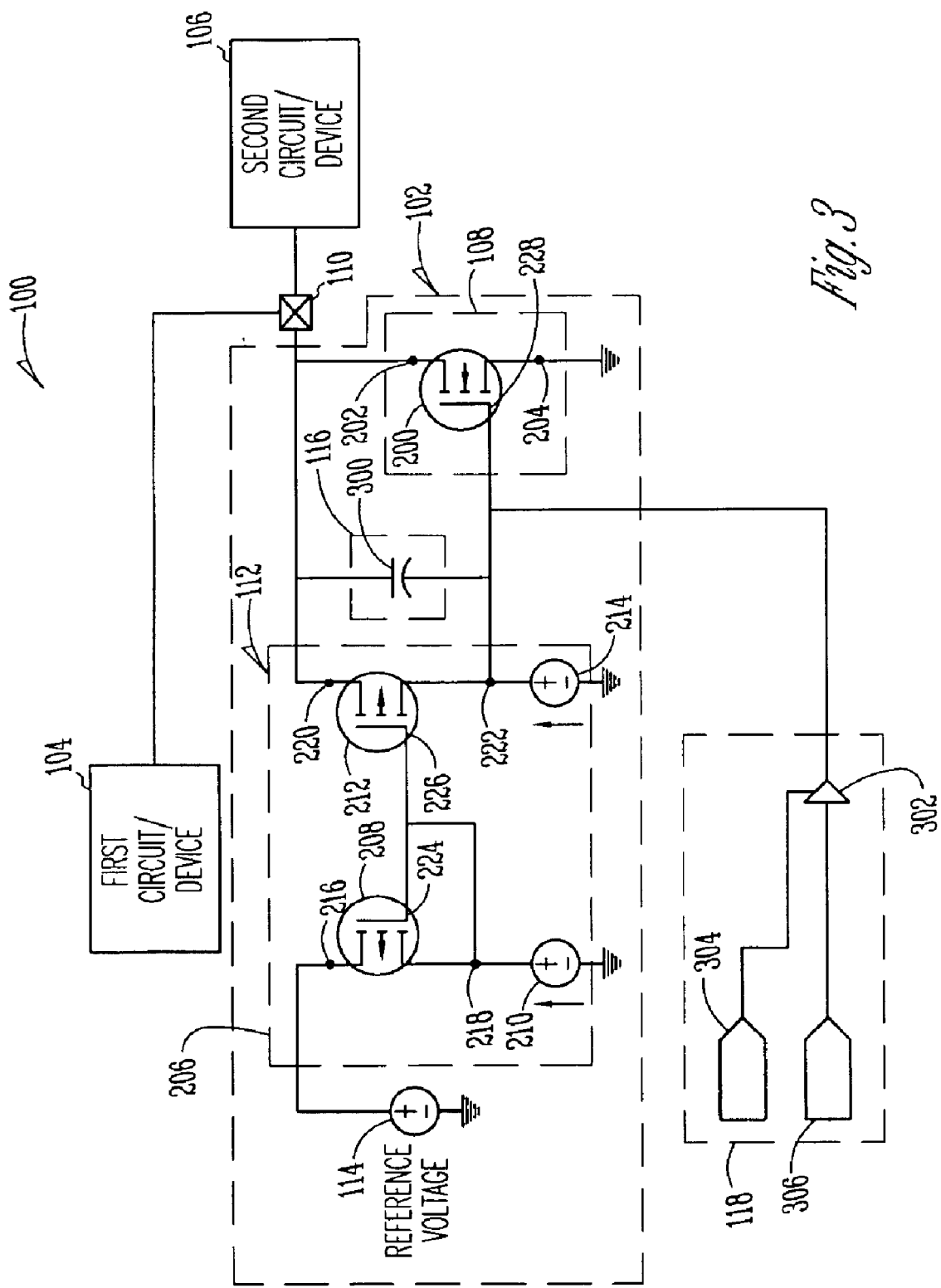
FIG. 3 is a schematic diagram of an electronic system including a voltage clamp circuit in accordance with another embodiment of the present invention.

FIG. 3 is a schematic diagram of the electronic system 100 from FIG. 1 including a voltage clamp circuit 102 in accordance with another embodiment of the present invention. As previously discussed, a slew-rate limiting circuit 116 may be connected between the I/O pad 110 and the gate 228 of the bypass transistor 200 to detect the rate of change of voltage at the I/O pad 110 and to operate or activate the bypass transistor 200 if the rate of change of voltage or slew-rate exceeds a predetermined maximum. The slew-rate limiting circuit 116 may include a capacitor 300 coupled between the I/O pad 110 and the gate 228 of the bypass transistor 200. In operation of the voltage clamp circuit 102, the capacitor 300 will charge and raise the level of the voltage at the gate 228 of the bypass transistor 200 to a selected level, such that if the rate of change of the voltage (dv/dt) at the I/O pad 110 exceeds a predetermined maximum determined by the value of the capacitor 300 (dv/dt>C×$I_{source}$, where $I_{source}$ is the second current source 214), the bypass transistor 200 will be activated to shunt the excess current to ground and thereby limit the slew rate at the I/O pad 110. Accordingly, the value of the capacitor 300 is selected to provide the predetermined maximum slew-rate or rate of change of the voltage that will be permitted at the I/O pad 110.

In another embodiment of the present invention, the voltage clamp circuit 102 may include the buffer circuit or driver circuit 118 as previously described. The buffer circuit 118 may be used with those circuits or devices that may be transmitting signals as well as receiving signals. Accordingly, the buffer circuit 118 will inactivate the bypass transistor 200 when the buffer circuit 118 is transmitting signals or data. An example of a buffer circuit 118 is shown in FIG. 3 and may include a tri-state buffer 302, a driver circuit or the like coupled to the gate 228 of the bypass transistor 200 to inactivate the bypass transistor 200 when the buffer circuit 118 is transmitting signals. The tri-state buffer 302 includes a control terminal 304 that is connected to receive an enable signal 306 to activate the tri-state buffer 302, and the tri-state buffer 302 includes at least one input terminal 308 to receive data signals 310 that may then be transmitted through the active tri-state buffer 302 and through the second transistor 212 to the I/O pad 110. The enable signal 306 and data signals 310 may be generated internally within a semiconductor chip in which the voltage clamp circuit 102 is formed or may originate from some other source such as the second circuit 106 or device.

Figure 4:
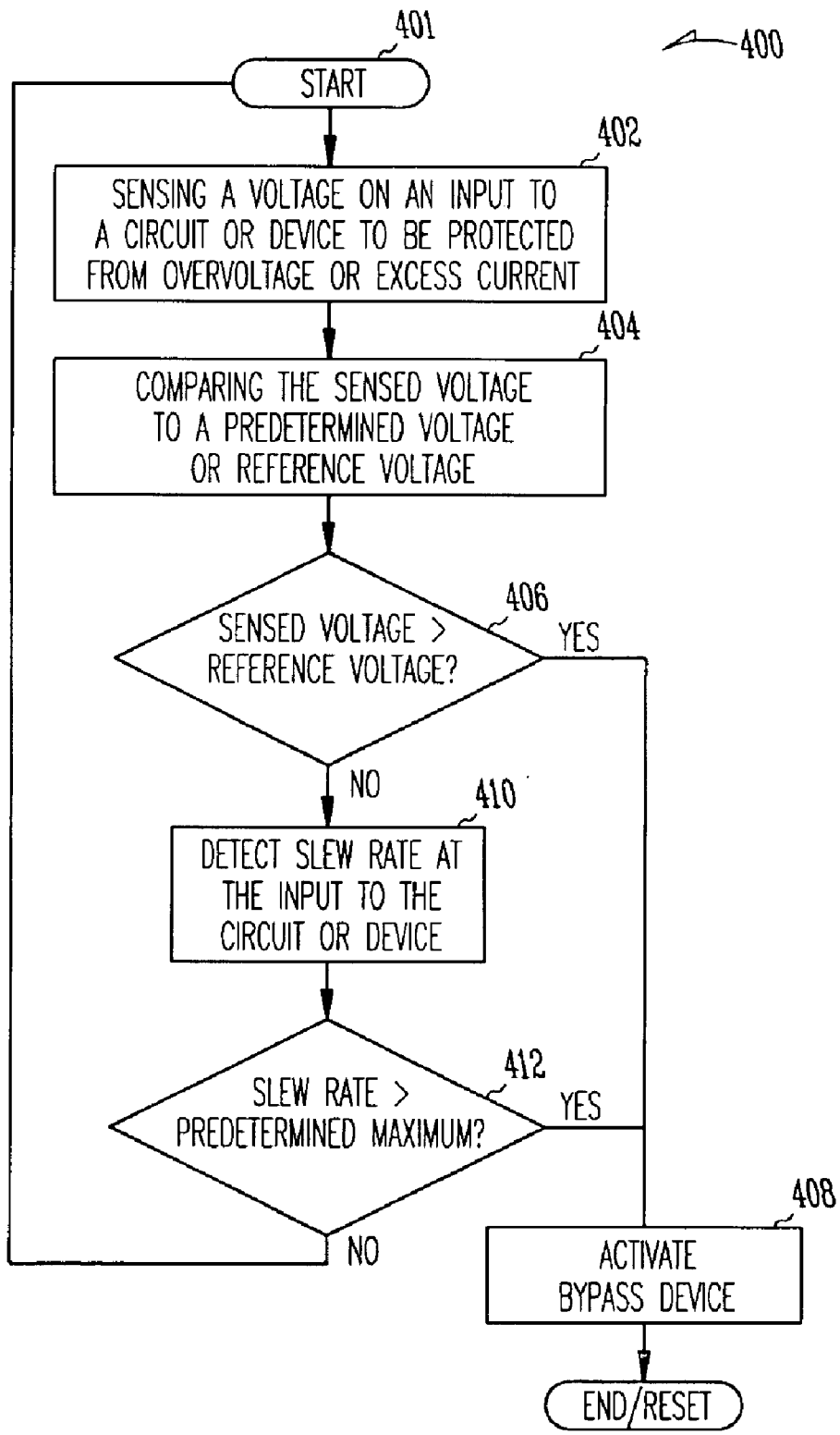
FIG. 4 is a flow chart illustrating a method of operation of a voltage clamp circuit in accordance with an embodiment of the present invention.

FIG. 4 is a flow chart illustrating a method 400 of operation of the voltage clamp 102 in accordance with an embodiment of the present invention. In block 402, a voltage is sensed on the input or I/O pad 110 of the circuit or device 106 to be protected from over-voltage or excess current. In action block 404, the sensed voltage is compared to a predetermined voltage or the reference voltage 114. In decision block 406, if the sensed voltage is greater than the reference voltage 114, the bypass device 108 is activated in block 408. If the sensed voltage is not greater than the reference voltage 114 in decision block 406, the slew rate at the input or I/O pad 110 is detected in block 410. If the slew rate is greater than a predetermined maximum in decision block 412, the bypass device 408 is activated. If the slew rate is not greater that the predetermined maximum slew rate in decision block 412, the method continues at the start block 401.

Figure 5:
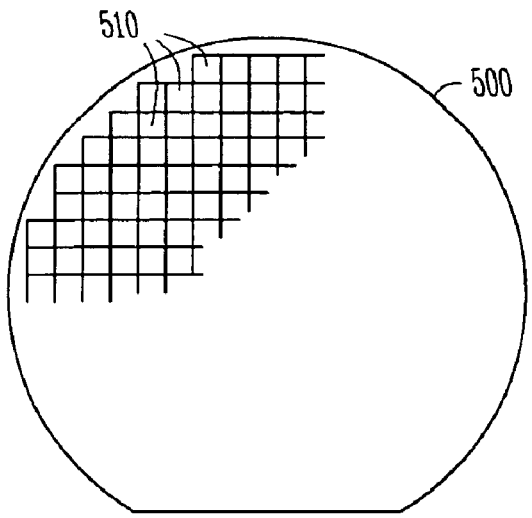
FIG. 5 is a top view of a wafer or substrate containing semiconductor dies in accordance with an embodiment of the present invention.

With reference to FIG. 5, a semiconductor die 510 may be produced from a silicon wafer 500 that may contain the voltage clamp circuit 102 and system 100 in accordance with the present invention. A die 510 is an individual pattern, typically rectangular, on a substrate that contains circuitry to perform a specific function. A semiconductor wafer 500 will typically contain a repeated pattern of such dies 510 containing the same functionality. Die 510 may further contain additional circuitry to extend to such complex devices as a monolithic processor with multiple functionality. Die 510 is typically packaged in a protective casing (not shown) with leads extending therefrom (not shown) providing access to the circuitry of the die 510 for unilateral or bilateral communication and control.

Figure 6:
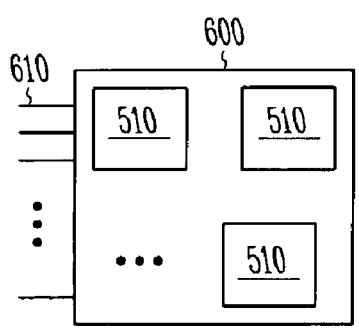
FIG. 6 is a block schematic diagram of a circuit module in accordance with an embodiment of the present invention.

As shown in FIG. 6, two or more dies 510 including at least one voltage clamp circuit 102 or system 100 in accordance with the present invention may be combined, with or without protective casing, into a circuit module 600 to enhance or extend the functionality of an individual die 510. Circuit module 600 may be a combination of dies 510 representing a variety of functions, or a combination of dies 510 containing the same functionality. Some examples of a circuit module 600 include memory modules, device drivers, power modules, communication modems, processor modules and application-specific modules and may include multi-layer, multi-chip modules. Circuit module 600 may be a sub-component of a variety of electronic systems, such as a clock, a television, a cell phone, a personal computer, an automobile, an industrial control system, an aircraft and others. Circuit module 600 will have a variety of leads 610 extending therefrom providing unilateral or bilateral communication and control.

Figure 7:
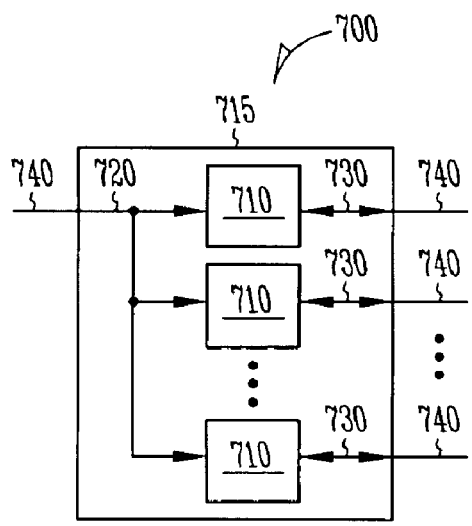
FIG. 7 is a block schematic diagram of a memory module in accordance with an embodiment of the present invention.

FIG. 7 shows one embodiment of a circuit module as memory module 700 containing circuitry for the inventive voltage clamp circuit 102. Memory module 700 generally depicts a Single In-line Memory Module (SIMM) or Dual In-line Memory Module (DIAM). A SIMM or DIAM may generally be a printed circuit board (PCB) or other support containing a series of memory devices. While a SIMM will have a single in-line set of contacts or leads, a DIAM will have a set of leads on each side of the support with each set representing separate I/O signals. Memory module 700 contains multiple memory devices 710 contained on support 715, the number depending upon the desired bus width and the desire for parity. Memory module 700 may contain memory devices 710 on both sides of support 715. Memory module 700 accepts a command signal from an external controller (not shown) on a command link 720 and provides for data input and data output on data links 730. The command link 720 and data links 730 are connected to leads 740 extending from the support 715. Leads 740 are shown for conceptual purposes and are not limited to the positions shown in FIG. 7.

Figure 8:
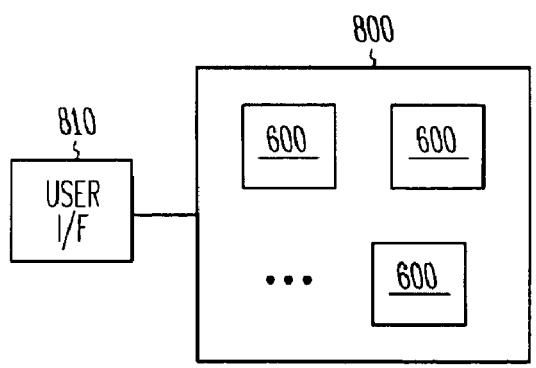
FIG. 8 is a block schematic diagram of an electronic system in accordance with another embodiment the present invention.

FIG. 8 shows an electronic system 800 containing one or more circuit modules 600 as described above containing the novel voltage clamp circuit 102. Electronic system 800 generally contains a user interface 810. User interface 810 provides a user of the electronic system 800 with some form of control or observation of the results of the electronic system 800. Some examples of user interface 810 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 810 may further describe access ports provided to electronic system 800. Access ports are used to connect an electronic system to the more tangible user interface components previously exemplified. One or more of the circuit modules 600 may be a processor providing some form of manipulation, control or direction of inputs from or outputs to user interface 810, or of other information either preprogrammed into, or otherwise provided to, electronic system 800. As will be apparent from the lists of examples previously given, electronic system 800 will often contain certain mechanical components (not shown) in addition to the circuit modules 600 and user interface 810. It will be appreciated that the one or more circuit modules 600 in electronic system 800 can be replaced by a single integrated circuit. Furthermore, electronic system 800 may be a sub-component of a larger electronic system.

Figure 9:
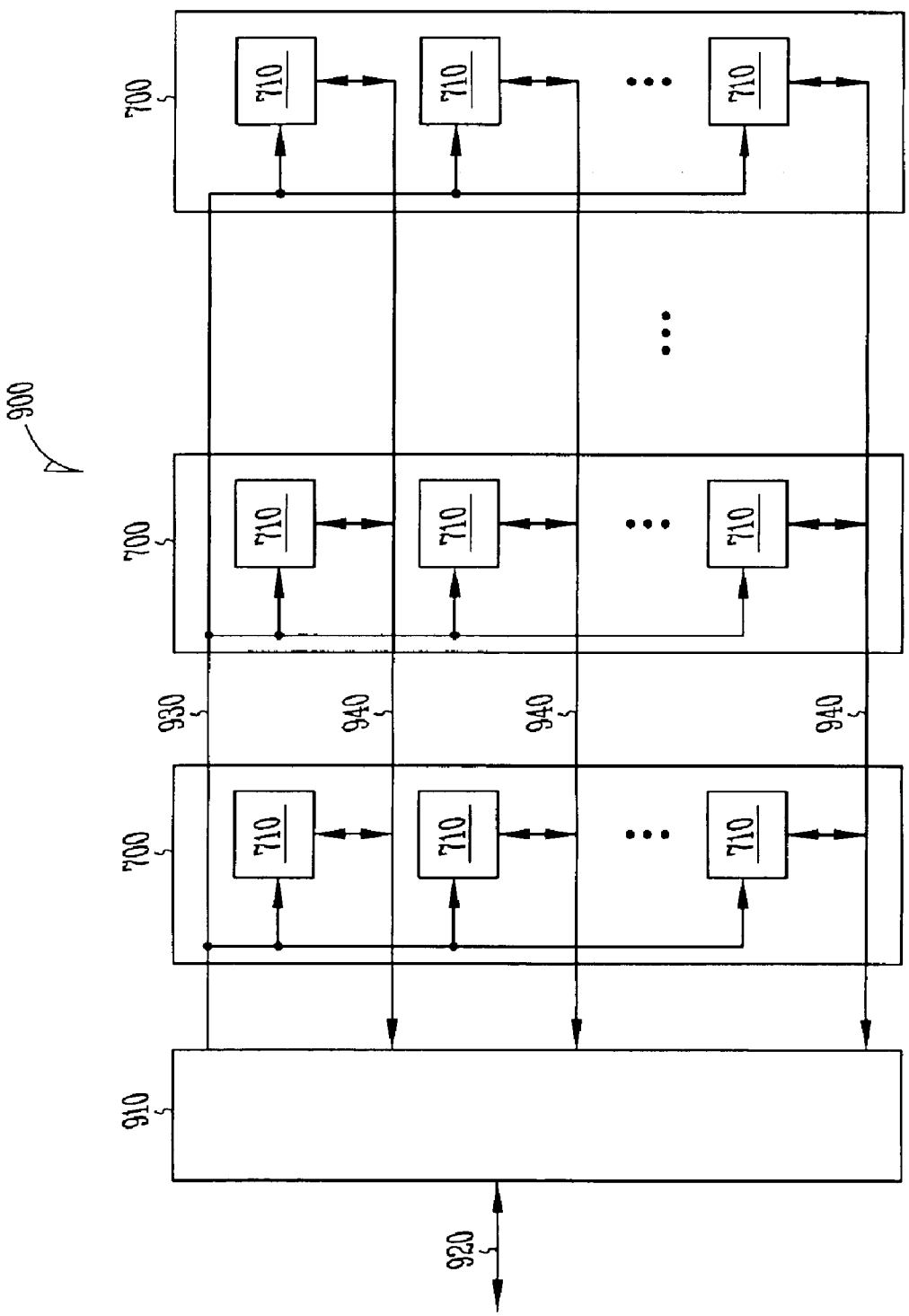
FIG. 9 is a block schematic diagram of a memory system in accordance with an embodiment of the present invention.

FIG. 9 shows one embodiment of an electronic system as memory system 900. Memory system 900 contains one or more memory modules 700 as described above including the voltage clamp circuit 102 in accordance with the present invention and a memory controller 910 that may also include circuitry for the inventive voltage clamp circuit 102. Memory controller 910 provides and controls a bidirectional interface between memory system 900 and an external system bus 920. Memory system 900 accepts a command signal from the external bus 920 and relays it to the one or more memory modules 700 on a command link 930. Memory system 900 provides for data input and data output between the one or more memory modules 700 and external system bus 920 on data links 940.

Figure 10:
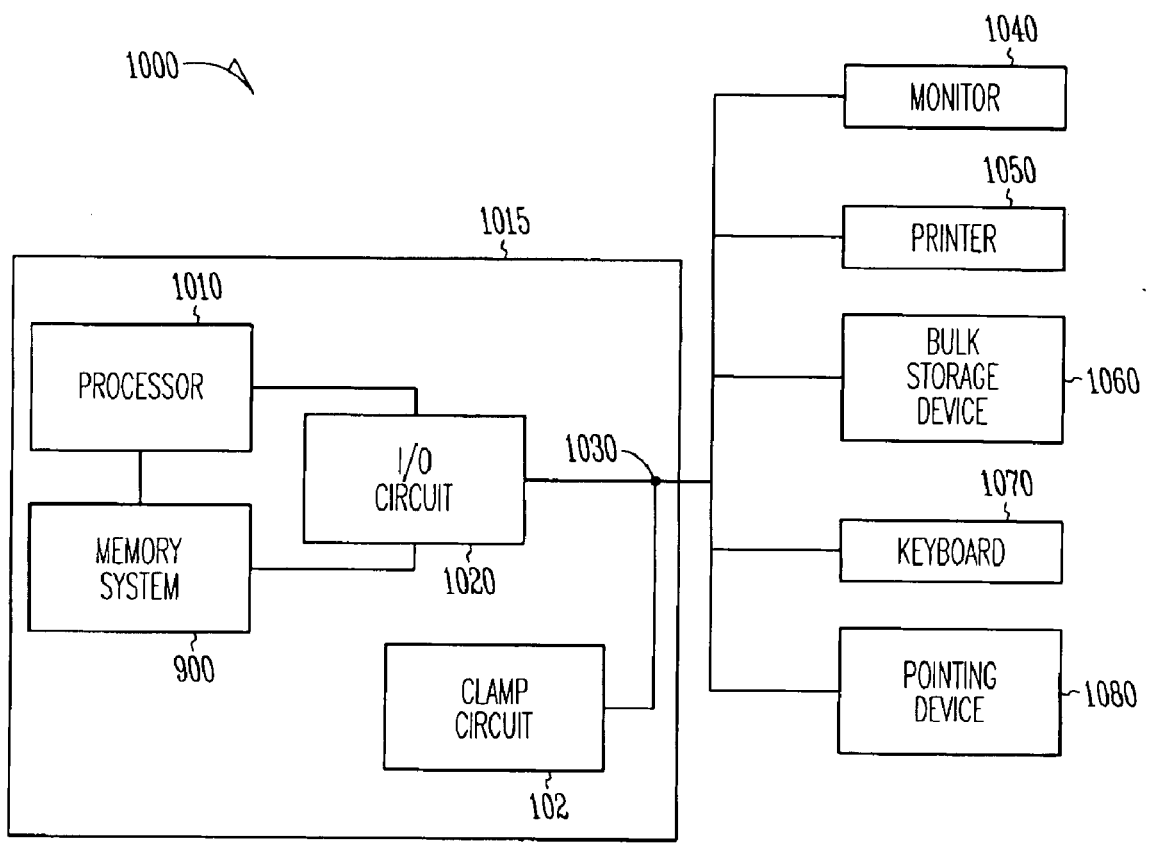
FIG. 10 is a block schematic diagram of a computer system in accordance with an embodiment of the present invention.

FIG. 10 shows a further embodiment of an electronic system as a computer system 1000. Computer system 1000 contains a processor 1010 and a memory system 900 housed in a computer unit 1015. Computer system 1000 is but one example of an electronic system containing another electronic system, i.e. memory system 900, as a sub-component. The computer system 1000 may contain an input/output (I/O) circuit 1020 that is coupled to the processor 1010 and the memory system 900. Computer system 1000 optionally contains user interface components that are coupled to the I/O circuit 1020. In accordance with the present invention a plurality of voltage clamp circuits 102 may each be coupled to one of a plurality of I/O pads or pins 1030 of the I/O circuit 1020. The I/O circuit 1020 may then be coupled a monitor 1040, a printer 1050, a bulk storage device 1060, a keyboard 1070 and a pointing device 1080. It will be appreciated that other components are often associated with computer system 1000 such as modems, device driver cards, additional storage devices, etc. It will further be appreciated that the processor 1010, memory system 900, I/O circuit 1020 and voltage clamp circuits 102 of computer system 1000 can be incorporated on a single integrated circuit. Such single package processing units reduce the communication time between the processor 1010 and the memory system 900.

CONCLUSION

The present invention thus provides a protection circuit or voltage clamp circuit 102 that can be formed as part of a semiconductor chip or die 510. The voltage clamp circuit 102 of the present invention is active and recoverable and may be designed to operate with appropriate speed according to the expected operating conditions. Additionally, the protection circuit or voltage clamp circuit 102 of the present invention may be used with circuits or devices that both transmit and receive signals and will not adversely affect operation in a transmit mode or may be disabled in a transmit mode.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. A voltage clamp circuit, comprising:
   a bypass device including a field effect transistor (FET) to shunt an overcurrent to ground;
   a differential sense amplifier to control operation of the bypass device, wherein the bypass device is activated in response to the differential sense amplifier sensing a voltage above a predetermined level; and
   a tri-state buffer circuit coupled to a gate of the bypass device for controlling the operation of the bypass device.

2. The voltage clamp circuit of claim 1, wherein the bypass device comprises an electronic switch.

3. A voltage clamp circuit, comprising:
   a bypass device;
   a differential sense amplifier to control operation of the bypass device, wherein the bypass device is activated in response to the differential sense amplifier sensing a voltage above a predetermined level;
   a tri-state buffer circuit coupled to a gate of the bypass device for controlling the operation of the bypass device;
   wherein the differential sense amplifier comprises:
      a first transistor connected between a reference voltage and a first current source; and
      a second transistor coupled to the bypass device and connected between a circuit to be protected by the voltage clamp circuit and a second current source.

4. A voltage clamp circuit, comprising
   a bypass device;
   a comparator circuit coupled to the bypass device to sense excess voltage, wherein the bypass device is activated in response to the comparator circuit sensing a voltage greater than a predetermined reference voltage;
   a slew-rate limiting circuit coupled to the bypass device; and
   a tri-state buffer coupled to a gate of the bypass device and coupling a control terminal of the tri-state buffer to a source of an enable signal.

5. The voltage clamp circuit of claim 4, wherein the bypass device comprises an electronic switch.

6. The voltage clamp circuit of claim 4, wherein the bypass device comprises a bypass transistor.

7. The voltage clamp of claim 4, wherein the comparator circuit comprises a differential sense amplifier.

8. The voltage clamp circuit of claim 4, wherein the comparator circuit comprises:
   a first transistor adapted to be connected between a reference voltage and a first current source; and
   a second transistor adapted to be connected between a circuit to be protected by the voltage clamp circuit and a second current source.

9. A voltage clamp circuit, comprising:
   a bypass device;
   a differential sense amplifier adapted to control operation of the bypass device, wherein the bypass device is activated in response to the differential sense amplifier sensing a voltage above a predetermined amount;
   a slew-rate limiting circuit coupled to the bypass device; and
   a tri-state buffer circuit coupled to a control input of the bypass device to allow the tri-state buffer circuit to turn off the bypass device.

10. The voltage clamp circuit of claim 9, wherein the slew-rate circuit comprises a capacitor coupled between a circuit to be protected and the bypass device.

11. A voltage clamp circuit, comprising:
    a bypass device;
    a differential sense amplifier adapted to control operation of the bypass device, wherein the bypass device is activated in response to the differential sense amplifier sensing a voltage above a predetermined amount;
    a slew-rate limiting circuit coupled to the bypass device;
    a driver coupled to the bypass device; and
    tri-state buffer circuit adapted to also control the bypass device when the bypass device must be disabled.

12. A voltage clamp circuit, comprising:
    a bypass device including a field effect transistor (FET) to shunt an overcurrent to ground;
    a differential sense amplifier adapted to control operation of the bypass device, wherein the bypass device is activated in response to the differential sense amplifier sensing a voltage above a predetermined amount; and
    a driver coupled to the bypass device wherein the driver is a tri-state buffer.

13. A voltage clamp circuit, comprising:
    a bypass device;
    a comparator circuit coupled to the bypass device to sense excess voltage, wherein the bypass device is activated to shunt an overcurrent to ground in response to the comparator circuit sensing a voltage greater than a predetermined reference voltage;
    a slew-rate limiting circuit coupled to the bypass device; and
    a tri-state buffer coupled to the bypass device to control operation of the bypass device.

14. A voltage clamp circuit, comprising:
    a first transistor coupled between a reference voltage and a first current source;
    a second transistor coupled between a second current source and a pad adapted to be connected to a circuit to be protected by the voltage clamp circuit, wherein a gate of the first transistor is coupled to a gate of the second transistor;
    a bypass device coupled between the pad and ground and including a gate coupled to the second transistor;
    a tri-state buffer circuit also coupled to the gate of the bypass device and coupling an input of the tri-state buffer circuit to a source of a control signal; and
    a slew-rate limiting circuit coupled to the bypass device.

15. A clamp circuit, comprising:
    a first transistor coupled between a reference voltage and a first current source;
    a second transistor coupled between a second current source and a pad adapted to be connected to a circuit to be protected by the voltage clamp circuit, wherein a gate of the first transistor is coupled to a gate of the second transistor;
    a bypass device coupled between the pad and ground, a gate of the bypass device being coupled to a node between the second transistor and the second current source;

a tri-state buffer circuit coupled to a gate of the bypass device and coupling a control terminal of the tri-state buffer circuit to a source of an enable signal; and a slew-rate limiting circuit coupled to the bypass device.

16. The clamp circuit of claim 15, wherein the slew-rate limiting circuit comprises a capacitor coupled between the pad and the gate of the bypass device.

17. A voltage clamp circuit, comprising:

a first transistor coupled between a reference voltage and a first current source;

a second transistor coupled between a second current source and a pad adapted to be connected to a circuit to be protected by the voltage clamp circuit, wherein a gate of the first transistor is coupled to a gate of the second transistor;

a bypass transistor coupled between the pad and ground, a gate of the bypass transistor being coupled to a node between the second transistor and the second current source;

a capacitor coupled between the pad and the gate of the bypass transistor; and a tri-state controlled buffer coupled to the gate of the bypass transistor to disable the bypass transistor.

18. A voltage clamp circuit, comprising:

a first transistor coupled between a reference voltage and a first current source;

a second transistor coupled between a second current source and a pad adapted to be connected to a circuit to be protected by the voltage clamp circuit, wherein a gate of the first transistor is coupled to a gate of the second transistor;

a bypass transistor coupled between the pad and ground, a gate of the bypass transistor being coupled to a node between the second transistor and the second current source;

a slew-rate limiting circuit coupled to the bypass transistor; and a tri-state buffer coupled to control the bypass device when the circuit to be protected is sending signals.

19. A electronic system, comprising:

an electronic circuit;

a bypass device coupled to the electronic circuit;

a differential sense amplifier adapted to control operation of the bypass device, wherein the bypass device is activated to protect the electronic circuit from an excess current in response to the differential sense amplifier sensing a voltage above a predetermined level;

a slew-rate limiting circuit coupled to the bypass device; and a tri-state buffer circuit coupled to a gate of the bypass device and coupling a control terminal of the tri-state buffer circuit to a source of an enable signal.

20. The electronic system of claim 19, wherein the bypass device comprises an electronic switch.

21. The electronic system of claim 19, wherein the bypass device comprises a bypass transistor.

22. The electronic system of claim 19, wherein the differential sense amplifier comprises:

a first transistor adapted to be connected between a reference voltage and a first current source; and a second transistor adapted to be connected between the electronic circuit and a second current source.

23. An electronic system, comprising:

an electronic circuit;

a comparator coupled to the electronic circuit;

a bypass device coupled to the electronic circuit, wherein the bypass device is activated to protect the electronic circuit in response to the comparator sensing a voltage greater than a predetermined reference voltage;

a slew-rate limiting circuit coupled to the bypass device; and a tri-state buffer coupled to the bypass device and coupling a control terminal of the tri-state buffer to an enable signal.

24. The electronic system of claim 23, wherein the comparator comprises a differential common gate sense amplifier.

25. The electronic system of claim 23, wherein the bypass device comprises a bypass transistor.

26. An electronic system, comprising:

an electronic circuit;

a comparator coupled to an input of the electronic circuit;

a bypass device coupled to the input of the electronic circuit, wherein the bypass device is activated to protect the electronic circuit in response to the comparator sensing a voltage greater than a predetermined reference voltage on the input of the electronic circuit;

a slew-rate limiting circuit coupled to the bypass device; and a tri-state buffer circuit coupled to the bypass device and coupling a control terminal of the tri-state buffer circuit to a source of an enable signal.

27. The electronic system of claim 26, wherein the slew-rate limiting circuit comprises a capacitor coupled between an input to the circuit and a node between the comparator and the bypass device.

28. An electronic system, comprising:

an electronic circuit;

a comparator coupled to an input of the electronic circuit;

a bypass device coupled to the input of the electronic circuit, wherein the bypass device is activated to protect the electronic circuit in response to the comparator sensing a voltage greater than a predetermined reference voltage on the input of the electronic circuit;

a slew-rate limiting circuit coupled to the bypass device; and a tri-state control buffer coupled to control the bypass device.

29. An electronic system, comprising:

an electronic circuit;

a first transistor coupled between a reference voltage and a first current source;

a second transistor coupled between a second current source and an input of the electronic circuit, wherein a gate of the first transistor is coupled to a gate of the second transistor;

a bypass transistor coupled between the input of the electronic circuit and ground, a gate of the bypass transistor being coupled to a node between the second transistor and the second current source;

a slew-rate limiting circuit coupled to the bypass transistor to cause the clamp transistor to clamp signals which change faster than a predetermined limit; and a tri-state buffer circuit also coupled to the gate of the bypass transistor to prevent the bypass transistor from clamping the signals.

30. An electronic system, comprising:
an electronic circuit;
a first transistor coupled between a reference voltage and a first current source;
a second transistor coupled between a second current source and an input to the electronic circuit, wherein a gate of the first transistor is coupled to a gate of the second transistor;
a bypass transistor coupled between the input of the electronic circuit and ground, a gate of the bypass transistor being coupled to a node between the second transistor and the second current source;
a slew-rate limiting circuit coupled between the input to the electronic device and the node between the second transistor and the second current source; and
a tri-state buffer coupled to a gate of the bypass transistor and coupling a control terminal of the tri-state buffer to a source of an enable signal.

31. The electronic system of claim 30, wherein the slew-rate limiting circuit comprises a capacitor coupled between the input of the electronic device and the node between the second transistor and the second current source.

32. An electronic system, comprising:
an electronic circuit;
a first transistor coupled between a reference voltage and a first current source;
a second transistor coupled between a second current source and an input to the electronic circuit, wherein a gate of the first transistor is coupled to a gate of the second transistor;
a bypass transistor coupled between the input to the electronic circuit and ground, a gate of the bypass transistor being coupled to a node between the second transistor and the second current source;
a tri-state buffer coupled to the gate of the bypass transistor source to enable or disable the bypass transistor; and
a slew-rate limiting circuit coupled to the bypass transistor to cause the clamp transistor to clamp signals which change faster than a predetermined limit.

33. A computer system, comprising:
a processor;
a memory system coupled to the processor;
an input/output (I/O) circuit coupled to the processor and the memory system; and
a voltage clamp circuit coupled to the I/O circuit, the voltage clamp circuit including:
a comparator circuit coupled to an I/O pad of the I/O circuit, and
a bypass device coupled to the I/O pad of the I/O circuit, wherein the bypass device is activated in response to the comparator circuit sensing a voltage greater than a predetermined reference voltage on the I/O pad of the I/O circuit source;
a slew-rate limiting circuit coupled to the bypass device to cause the bypass device to clamp signals which have a rate of change greater than a predetermined limit; and
a tri-state buffer coupled to a gate of the bypass device and coupling a control terminal of the tri-state buffer to a source of an enable signal wherein the bypass device is disabled in one of transmit or receive mode.

34. The computer system of claim 33, wherein the comparator circuit comprises a differential common gate sense amplifier.

35. The computer system of claim 33, wherein the bypass device comprises a bypass transistor.

36. A computer system, comprising:
a processor;
a memory system coupled to the processor;
an input/output circuit coupled to the processor and the memory system; and
a voltage clamp circuit coupled to the input/output circuit, the voltage clamp circuit including:
a bypass device coupled to the input/output circuit,
a differential sense amplifier adapted to control operation of the bypass device, wherein the bypass device is activated in response to the differential sense amplifier sensing a voltage above a predetermined level;
a slew-rate limiting circuit coupled to the bypass device to cause the bypass device to clamp signals which have a rate of change greater than a predetermined limit; and
a tri-state buffer coupled to a gate of the bypass device and coupling an enable signal to enable the bypass device to clamp signals.

37. A computer system, comprising:
a processor;
a memory system coupled to the processor;
an input/output circuit coupled to the processor and the memory system; and
a voltage clamp circuit coupled to the input/output circuit, the voltage clamp circuit including:
a comparator coupled to an I/O pad of the input/output circuit,
a bypass device coupled to the I/O pad of the input/output circuit, wherein the bypass device is activated in response to the comparator sensing a voltage greater than a predetermined reference voltage on the I/O pad of the input/output circuit,
a slew-rate limiting circuit coupled between the I/O pad of the input/output circuit and the bypass device; and
a tri-state buffer coupled to a control gate of the bypass device and coupling a control terminal of the tri-state buffer to a source of an enable signal.

38. The computer system of claim 37, wherein the slew-rate limiting circuit comprises a capacitor.

39. A computer system, comprising:
a processor;
a memory system coupled to the processor;
an input/output circuit coupled to the processor and the memory system; and
a voltage clamp circuit coupled to the input/output circuit, the voltage clamp circuit including:
a comparator circuit coupled to an I/O pad of the input/output circuit,
a bypass device coupled to the I/O pad of the input/output circuit, wherein the bypass device is activated in response to the comparator circuit sensing a voltage greater than a predetermined reference voltage at the I/O pad of the input/output circuit,
a tri-state buffer coupled to the bypass device to enable or disable the bypass device upon the input/output circuit performing one of transmitting and receiving; and
a slew-rate limiting circuit coupled between the I/O pad and the bypass device to cause the bypass device to clamp signals which have a rate of change greater than a predetermined limit.

40. A computer system, comprising:
a processor;
a memory system coupled to the processor;
an input/output circuit coupled to the processor and the memory system; and
a voltage clamp circuit coupled to the input/output circuit, the voltage clamp circuit including:
  a first transistor coupled between a reference voltage and a first current source,
  a second transistor coupled between a second current source and an I/O pad of the input/output circuit, wherein a gate of the first transistor is coupled to a gate of the second transistor,
  a bypass transistor coupled between the I/O pad of the input/output circuit and ground, a gate of the bypass transistor being coupled to a node between the second transistor and the second current source;
  a slew-rate limiting circuit coupled to the bypass device and the I/O pad; and
  a tri-state buffer coupled to an enable signal to control the bypass device.

41. A semiconductor die, comprising:
a substrate; and
an integrated circuit supported by the substrate, wherein the integrated circuit includes at least one internal circuit and a voltage clamp circuit coupled to the at least one internal circuit, the voltage clamp circuit including:
  a comparator coupled to an input of the at least one internal circuit, and
  a bypass device coupled to the input to the at least one internal circuit, wherein the bypass device is activated in response to the comparator sensing a voltage greater than a predetermined reference voltage on the input of the at least one internal circuit;
a slew-rate limiting circuit coupled between the one internal circuit and the bypass device; and
  a tri-state buffer coupled to a gate of the bypass device and coupling a control terminal of the tri-state buffer to a source of an enable signal.

42. A semiconductor die, comprising:
a substrate; and
an integrated circuit supported by the substrate, wherein the integrated circuit includes at least one internal circuit and voltage clamp circuit coupled to the at least one internal circuit, the voltage clamp circuit including:
  a bypass device coupled to an input to the at least one internal circuit, and
  a differential sense amplifier adapted to control operation of the bypass device, wherein the bypass device is activated in response to the differential sense amplifier sensing a voltage above a predetermined level at the input to the at least one internal circuit;
a slew-rate limiting circuit coupled to the bypass device and
a tri-state buffer coupled to a gate of the bypass device and coupling a control terminal of the tri-state buffer to a source of an enable signal wherein the bypass device is disabled in one of transmit or receive mode of the internal circuit.

43. A semiconductor die, comprising:
a substrate; and
an integrated circuit supported by the substrate, wherein the integrated circuit includes at least one internal circuit and voltage clamp circuit coupled to the at least one internal circuit, the voltage clamp circuit including:
  a comparator coupled to an input of the at least one internal circuit,
  a bypass device coupled to the input of the at least one internal circuit, wherein the bypass device is activated in response to the comparator sensing a voltage greater than a predetermined reference voltage on the input of the at least one internal circuit,
  a slew-rate limiting circuit coupled between the input of the at least one internal circuit and the bypass device.
  a tri-state buffer coupled to a control input of the bypass device and coupling a control terminal of the tri-state buffer to an enable signal wherein the bypass device is disabled in one of transmit or receive mode of the internal circuit.

44. A semiconductor die, comprising:
a substrate; and
an integrated circuit supported by the substrate, wherein the integrated circuit includes at least one internal circuit and voltage clamp circuit coupled to the at least one internal circuit, the voltage clamp circuit including:
a comparator circuit coupled to an input of the at least one internal circuit,
a bypass device coupled to the input of the at least one internal circuit, wherein the bypass device is activated in response to the comparator circuit sensing a voltage greater than a predetermined reference voltage on the input of the at least one internal circuit,
a buffer coupled to the bypass device;
a slew-rate limiting circuit coupled to the bypass device; and
a tri-state buffer coupled to a control input to the bypass device and operable for coupling an enable signal wherein the bypass device is disabled in one of transmit or receive mode of the internal circuit.

45. A semiconductor die, comprising:
a substrate; and
an integrated circuit supported by the substrate, wherein the integrated circuit includes at least one internal circuit and a voltage clamp circuit coupled to the at least one internal circuit, the voltage clamp circuit including:
  a first transistor coupled between a reference voltage and a first current source,
  a second transistor coupled between a second current source and an input of the at least one internal circuit, wherein a gate of the first transistor is coupled to a gate of the second transistor,
  a bypass transistor coupled between the input of the at least one internal circuit and ground, a gate of the bypass transistor being coupled to a node between the second transistor and the second current source;
  a slew-rate limiting circuit coupled to the bypass device and the I/O pad; and
  a tri-state buffer coupled to a control gate of the bypass device and operable for coupling an enable signal through the tri-state buffer wherein the bypass device is disabled by the tri-state buffer in one of transmit or receive mode of the internal circuit.

46. A method for protecting an electronic device from an over-voltage, comprising:
sensing a voltage greater than a predetermined voltage; and
bypassing an input of the electronic device in response to sensing the voltage greater than the predetermined voltage;

slew-rate limiting the input of the electronic device to clamp signals which have a slew-rate greater than a predetermined level; and enabling the bypassing with a tri-state buffer wherein the bypassing is disabled in one of a transmit or a receive mode.

47. A method of protecting an electronic device from an over-voltage, comprising:

comparing a voltage on an input to the electronic device to a predetermined voltage;

activating a bypass device in response to the voltage on the input being greater than the predetermined voltage, wherein a difference in voltage level between the voltage on the input and the predetermined voltage is used to activate the bypass device; and limiting the slew-rate of the input of the electronic device to clamp signals which have a slew-rate greater than a predetermined level; and tri-state enabling the activating of the bypass device with a tri-state buffer wherein the activating is disabled in one of a transmit or a receive mode on the input.

48. A method of protecting an electronic device from an over-voltage, comprising:

comparing a voltage on an input of the electronic device to a predetermined voltage;

sensing a slew rate at the input of the electronic device;

activating a bypass device in response to at least one of the voltage on the input being greater than the predetermined voltage or the slew rate at the input being greater than a predetermined maximum; and enabling and disabling the activating of the bypass device with a tri-state buffer wherein the activating is disabled in one of a transmit or a receive mode on the input.

49. A method for making a clamp circuit, comprising:

forming a bypass device;

forming a comparator circuit coupled to the bypass device, wherein the bypass device is activated in response to the comparator circuit sensing a voltage greater than a predetermined reference voltage.

forming a slew-rate limiting circuit to clamp signals which have a rate of change greater than a preset level; and forming a tri-state control device to control the bypass device so the bypass device is disabled during a transmit mode of operation.

50. A method for making a clamp circuit, comprising:

forming a bypass device;

forming a differential sense amplifier adapted to control operation of the bypass device, wherein the bypass device is activated in response to the differential sense amplifier sensing a voltage above a predetermined level;

forming a slew-rate limiting circuit coupled to the bypass device; and forming a tri-state buffer to control the bypass device so the bypass device is enabled or disabled during a transmit mode of operation.

51. The method of claim 50, wherein forming the bypass device comprises forming a transistor including a first source/drain terminal coupled to an input of a device to be protected, a second source/drain terminal coupled to ground and a gate terminal coupled to the differential amplifier.

52. The method of claim 50, wherein forming the differential sense amplifier comprises:

forming a first transistor including a first source/drain terminal coupled to a reference voltage and a second source/drain terminal coupled to a first current source; and forming a second transistor including a first source/drain terminal coupled to a device to be protected and second source/drain terminal coupled to a second current source and to the bypass device and a gate terminal coupled to a gate terminal of the first transistor and to the second source/drain terminal of the first transistor.

53. A method for making a clamp circuit, comprising:

forming a bypass device;

forming a differential sense amplifier adapted to control operation of the bypass device, wherein the bypass device is activated in response to the differential sense amplifier sensing a voltage above a predetermined voltage level;

forming a slew-rate limiting circuit coupled to the bypass device; and forming a tri-state buffer to control the bypass device so the bypass device is disabled during a transmit mode of operation.

54. The method of claim 53, wherein forming the slew-rate limiting circuit comprises coupling a capacitor between an input to a circuit to be protected and gate of the bypass device.

55. A method for making a clamp circuit, comprising:

forming a bypass device;

forming a differential sense amplifier adapted to control operation of the bypass device, wherein the bypass device is activated in response to the differential sense amplifier sensing a voltage above a predetermined voltage level;

forming a buffer coupled to the bypass device;

forming a slew-rate limiting circuit coupled to the bypass device; and forming a tri-state buffer coupled for controlling the bypass device so the bypass device is disabled during one of a transmit mode or receive mode of operation.

56. A method for making a clamp circuit, comprising:

forming a bypass device which includes a field effect transistor (FET) to shunt an overcurrent to ground;

forming a differential sense amplifier adapted to control operation of the bypass device, wherein the bypass device is activated in response to the differential sense amplifier sensing a voltage above a predetermined voltage level; and forming a buffer coupled to the bypass device wherein forming the buffer includes forming a tri-state buffer circuit coupled to a gate of the bypass device and coupling a control terminal of the tri-state buffer circuit to a source of an enable signal and coupling an input terminal of the tri-state buffer circuit to a source of a data signals.

57. A method of making a clamp circuit, comprising:

forming a first transistor adapted to be coupled between a reference voltage and a first current source;

forming a second transistor adapted to be coupled between a second current source and a circuit to be protected by the voltage clamp circuit;

coupling a gate of the first transistor to a gate of the second transistor;

forming a bypass transistor;

coupling a gate of the bypass transistor to a node between the second transistor and the second current source.

coupling a slew-rate control capacitor between the bypass transistor and the circuit to be protected by the voltage clamp circuit; and forming a tri-state buffer to control the bypass device so the bypass device is disabled during a transmit mode of operation.

58. A method of making an electronic system, comprising:

forming at least one electronic circuit;

forming a comparator circuit coupled to an input of the electronic circuit;

forming a bypass device coupled to the input of the electronic circuit, wherein the bypass device is activated in response to the comparator circuit sensing a voltage greater than a predetermined reference voltage on the input of the electronic circuit or in response to a slew-rate sensing device sensing a rate of change on the input which is greater than a predetermined value and wherein the bypass device includes a field effect transistor (FET) to shunt an overcurrent to ground; and forming a tri-state buffer coupled to a gate of the bypass device and coupling a control terminal of the tri-state buffer to a source of an enable signal and coupling an input terminal of the tri-state buffer to a source of a data signal.

59. The method of claim 58, wherein forming the bypass device comprises forming a transistor including a first source/drain terminal coupled to the input to the at least one electronic circuit, a second source/drain terminal coupled to a second source/drain terminal and a gate coupled to the comparator circuit.

60. A method of making an electronic system, comprising:

forming at least one electronic circuit;

forming a bypass device coupled to the at least one electronic circuit wherein the bypass devices includes a field effect transistor (FET) to shunt an overcurrent to ground;

forming a differential sense amplifier adapted to control operation of the bypass device, wherein the bypass device is activated in response to the differential sense amplifier sensing a voltage above a predetermined level or in response to a slew-rate sensing device sensing a rate of change on the input which is greater than a predetermined value; and forming a tri-state buffer coupled to a gate of the bypass device and coupling a control terminal of the tri-state buffer to a source of an enable signal and coupling an input terminal of the tri-state buffer to a source of a data signal.

61. A method of making an electronic system, comprising:

forming at least one electronic circuit;

forming a bypass device coupled to an input to the at least one electronic circuit;

forming a differential sense amplifier adapted to control operation of the bypass device, wherein the bypass device is activated in response to the differential sense amplifier sensing a voltage above a predetermined voltage level;

forming a slew-rate limiting circuit coupled to the bypass device; and forming a tri-state buffer coupled to a gate of the bypass device and coupling a control terminal of the tri-state buffer to a source of an enable signal and coupling an input terminal of the tri-state buffer to a source of a data signal.

62. A method of making an electronic system, comprising:

forming at least one electronic circuit;

forming a first transistor adapted to be coupled between a reference voltage and a first current source;

forming a second transistor adapted to be coupled between a second current source and an input of the electronic circuit;

coupling a gate of the first transistor to a gate of the second transistor;

forming a bypass transistor coupled to the input of the electronic circuit;

coupling a gate of the bypass transistor to a node between the second transistor and the second current source;

coupling a slew-rate control capacitor between the input of the electronic circuit and the gate of the bypass transistor; and coupling an output of a tri-state buffer to a gate of the bypass transistor and coupling a control terminal of the tri-state buffer to a source of an enable signal and coupling an input terminal of the tri-state buffer to a source of a data signal.

63. A method of making a computer system, comprising:

forming a processor;

forming a memory system coupled to the processor;

forming an input/output circuit coupled to the processor and the memory system; and forming a voltage clamp circuit coupled to the input/output circuit, forming the voltage clamp circuit including:

forming a comparator circuit coupled to an I/O pad of the input/output circuit, forming a bypass device coupled to the I/O pad of the input/output circuit, wherein the bypass device is activated in response to the comparator circuit sensing a voltage greater than a predetermined reference voltage on the I/O pad of the input/output circuit voltage;

forming a slew-rate limiting circuit to clamp signals which have a rate of change greater than a preset level; and forming a tri-state buffer coupled to a gate of the bypass device and coupling a control terminal of the tri-state buffer to an enable signal for enabling a receive mode of the I/O pad.

64. A method of forming a computer system, comprising:

forming a processor;

forming a memory system coupled to the processor;

forming an input/output circuit coupled to the processor and the memory system; and forming a voltage clamp circuit coupled to the input/output circuit, forming the voltage clamp circuit including:

forming a bypass device coupled to the input/output circuit, forming a differential sense amplifier adapted to control operation of the bypass device, wherein the bypass device is activated in response to the differential sense amplifier sensing a voltage above a predetermined voltage level voltage;

forming a slew-rate limiting circuit to clamp signals which have a rate of change greater than a preset level; and forming a tri-state buffer coupled to a control input of the bypass device and coupling a control terminal of the tri-state buffer to a source of an enable signal and coupling an input terminal of the tri-state buffer to a source of a data signal.

65. A method of making a computer system, comprising:

forming a processor;

forming a memory system coupled to the processor;

forming an input/output circuit coupled to the processor and the memory system; and forming a voltage clamp circuit coupled to the input/output circuit, forming the voltage clamp circuit including:
- forming a first transistor coupled between a reference voltage and a first current source,
- forming a second transistor coupled between a second current source and an I/O pad of the input/output circuit, wherein a gate of the first transistor is coupled to a gate of the second transistor,
- forming a bypass transistor coupled between the I/O pad of the input/output circuit and ground, a gate of the bypass transistor being coupled to a node between the second transistor and the second current source voltage;
- forming a slew-rate limiting circuit coupled between the I/O pad of the input/output circuit and the gate of the bypass transistor; and
- forming a tri-state buffer coupled to a gate of the bypass transistor and coupling a control terminal of the tri-state buffer to a source of an enable signal.

66. A method of making an integrated circuit, comprising:

providing a substrate;

forming at least one electronic circuit supported on the substrate; and forming a voltage clamp coupled to the at least one electronic circuit, wherein forming the voltage clamp includes:
- forming a comparator circuit coupled to an input of the at least one electronic circuit,
- forming a bypass device coupled to the at least one electronic circuit, wherein the bypass device is activated in response to the comparator circuit sensing a voltage greater than a predetermined reference voltage on the input of the at least one electronic circuit. voltage;
- forming a slew-rate limiting circuit coupled between the at least one electronic circuit and the bypass device to clamp signals which exceed a predetermined slew-rate; and
- forming a tri-state buffer coupled to a gate of the bypass device and coupling a control terminal of the tri-state buffer to a source of an enable signal and coupling an input terminal of the tri-state buffer to a source of a data signals.

67. A method of making an integrated circuit, comprising:

providing a substrate;

forming at least one electronic circuit supported on the substrate; and forming a voltage clamp coupled to the at least one electronic circuit, wherein forming the voltage clamp includes:
- forming a bypass device coupled to the at least one electronic circuit,
- forming a differential sense amplifier adapted to control operation of the bypass device, wherein the bypass device is activated in response to the differential sense amplifier sensing a voltage above a predetermined voltage level voltage;
- forming a slew-rate limiting circuit coupled to the bypass device; and
- forming a tri-state buffer coupled to a gate of the bypass device and coupling a control terminal of the tri-state buffer to a source of an enable signal and coupling an input terminal of the tri-state buffer to a source of a data signals.

68. A method of making an integrated circuit, comprising:

providing a substrate;

forming at least one electronic circuit supported on the substrate; and forming a voltage clamp coupled to the at least one electronic circuit, wherein forming the voltage clamp includes:
- forming a first transistor coupled between a reference voltage and a first current source,
- forming a second transistor coupled between a second current source and an input to the at least one electronic circuit, wherein a gate of the first transistor is coupled to a gate of the second transistor,
- forming a bypass transistor coupled between the input to the at least one electronic circuit and ground, a gate of the bypass transistor being coupled to a node between the second transistor and the second current source voltage;
- forming a slew-rate limiting circuit coupled between the input to the at least one electronic circuit and the gate of the bypass transistor, and
- forming a tri-state buffer coupled to the gate of the bypass transistor and coupling a control terminal of the tri-state buffer to a source of an enable signal and coupling an input terminal of the tri-state buffer to a source of a data signal.

* * * * *

UNITED STATES PATENT AND TRADEMARK OFFICE
CERTIFICATE OF CORRECTION

PATENT NO. : 6,897,703 B2
DATED : May 24, 2005
INVENTOR(S) : Hunt

It is certified that error appears in the above-identified patent and that said Letters Patent is hereby corrected as shown below:

Column 3,
Line 31, after "2" insert -- is --.

Column 5,
Line 16, after "2" insert -- is --.

Column 11,
Line 24, delete "controlled" and insert -- control --, therefor.

Column 15,
Line 48, after "circuit," delete "and".

Column 16,
Line 10, delete "device." and insert -- device and --, therefor.

Column 17,
Line 43, delete "voltage." and insert -- voltage; --, therefor.

Column 19,
Line 3, delete "source." and insert -- source; --, therefor.
Line 39, delete "devices" and insert -- device --, therefor.

Column 21,
Line 45, after "circuit" delete ".".

UNITED STATES PATENT AND TRADEMARK OFFICE
CERTIFICATE OF CORRECTION

PATENT NO. : 6,897,703 B2
DATED : May 24, 2005
INVENTOR(S) : Hunt

It is certified that error appears in the above-identified patent and that said Letters Patent is hereby corrected as shown below:

<u>Column 22,</u>
Line 45, delete "transistor," and insert -- transistor; --, therefor.

Signed and Sealed this

Ninth Day of August, 2005

JON W. DUDAS
*Director of the United States Patent and Trademark Office*